(12) United States Patent
Rice

(10) Patent No.: US 6,388,539 B1
(45) Date of Patent: May 14, 2002

(54) BROADBAND SWITCH/COUPLER

(75) Inventor: Christopher W Rice, Parsippany, NJ (US)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 09/835,612

(22) Filed: Apr. 16, 2001

(51) Int. Cl.[7] ................................. H01P 1/10
(52) U.S. Cl. ..................... 333/25; 333/32; 333/258
(58) Field of Search .................. 333/25, 26, 32, 333/258; 330/301, 124 D, 116, 117; 455/3.3

(56) References Cited

U.S. PATENT DOCUMENTS 3,714,597 A * 1/1973 Reynolds .................... 330/275
5,422,599 A * 6/1995 Larsen ........................ 330/196
5,963,843 A * 10/1999 Sit et al. ...................... 455/3.3

* cited by examiner

Primary Examiner—Robert Pascal
Assistant Examiner—Dean Takaoka

(57) ABSTRACT

Parallel combined redundancy and switched redundancy are provided for active RF devices (i.e., amplifiers) in a cable plant system with a switch/coupler circuit of passive magnetic devices and switches that respond to an amplifier failure by switching the circuit into a combined or switched redundancy mode as needed to maintain a suitable dynamic range of operation. In either redundancy mode, the switch/coupler circuit operates with a constant 3dB reduction of dynamic range.

13 Claims, 2 Drawing Sheets

BROADBAND SWITCH/COUPLER

FIELD OF THE INVENTION

This invention relates to availability of active devices in a coaxial cable plant and in particular to increasing the availability of RF amplifiers in the coaxial cable plant without lowering network efficiency.

BACKGROUND OF THE INVENTION

Signal transmission systems using cable transport media tend to be highly lossy compared with such transmission systems as over the air radio media. Cable is generally intended to be coaxial cable, which defines a specific wired technology. These systems normally use trunk cables to transmit from a headend source to distribution nodes. Distribution cabling connects the nodes to drop points where drop lines are connected to a receiving customer. It is becoming common to replace the trunk lines with optical fiber cable due to its wider bandwidth and lower loss. The distribution or feeder coaxial cabling however is largely already in place and remains the transmission media of choice. Due to the many tap off points of a distribution cable the use of many cascaded amplifiers is needed to maintain a desired signal strength and quality. Failure of any amplifier can seriously degrade the signal integrity, down stream from the failure, ranging from a poor signal-to-noise ratio (SNR) up to an outright failure of the signal transmission. Hence, continuous provision of quality amplification is very important.

Provision of needed amplification may largely be secured by parallel combined or switched redundancy whereby continuously operating amplifiers are arranged in parallel or in backup switched redundancy systems where operative amplifiers are substituted for failed amplifiers. Combined paralleled redundancy allows two amplifiers to operate continuously resulting in reduced requirements on the individual amplifiers. However, the coupling in a parallel mode requires the use of a combining device. Should one of the amplifiers fail the combining device couples to only one active path and the inactive path termination introduces added noise into the cable system. This failure mode not only reduces the amplification gain it also introduces a loss due to a parallel path termination into the system. All subsequent cascaded amplifiers amplify this noise.

Switched redundancy systems provide amplification of the same quality but require extensive insertion into the system of inactive amplifiers, which in a capital-intensive cable system is undesirable. It is desirable to utilize the benefit of switched redundancy without retrofitting the amplification system to remove the combined redundancy amplifier arrangements.

SUMMARY OF THE INVENTION

Advantages of the parallel combined redundancy and of the switched redundancy are provided by use of a broadband switch/combiner that flexibly allows active amplification devices to be either switched combined or parallel combined. Sensing circuitry monitoring the amplifier's operating state control the switch/combiner so that in the event of an amplifier failure the maximum loss incurred is that of the lost amplifier only, as opposed to the losses incurred in present systems.

In a particular exemplary embodiment, parallel combined redundancy and switched redundancy are provided for active RF devices (i.e., amplifiers) in a cable plant system with a switch/coupler circuit of passive magnetic devices and switches that respond to an amplifier failure by switching the circuit into a combined or switched redundancy mode as needed to maintain a suitable dynamic range of operation. In either redundancy mode, the switch/coupler circuit operates with a constant 3dB reduction of dynamic range.

DETAILED DESCRIPTION

Figure 1A:
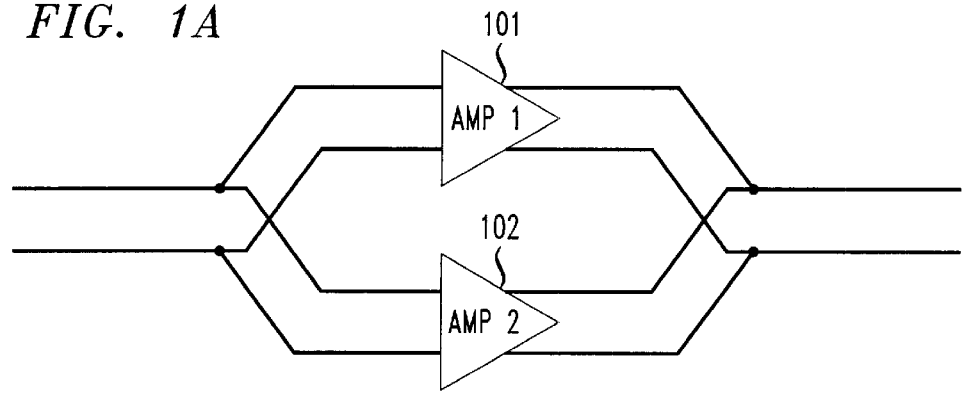
FIG. 1 is a schematic of an amplifier connection in a cable system and the effect of an amplifier failure.
Figure 1B:
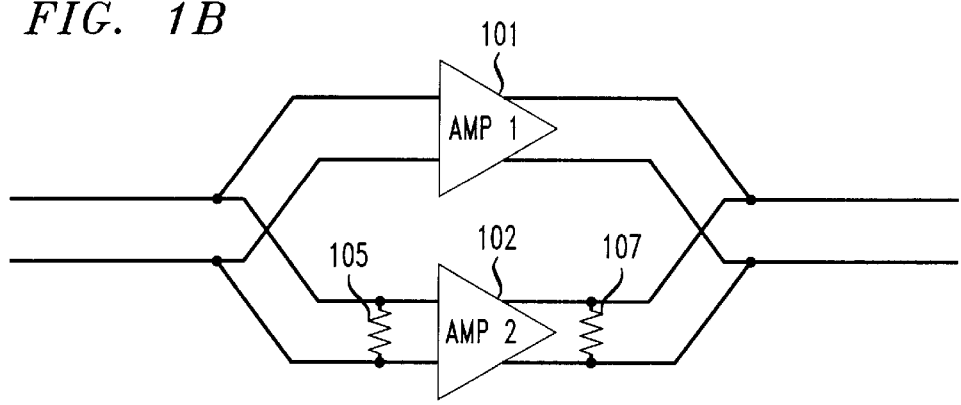

Amplifiers are normally paired or paralleled in cable networks to improve reliability and permit the added amplification provided by the simultaneously active amplifier devices. This reduces the requirements for any active amplifier device. Such an arrangement is schematically shown in FIG. 1A. It is readily apparent that should one of the amplifiers 101 or 102 fail, that one of the parallel paths is essentially disabled. Termination resistances 105 and 107, as shown in the FIG. 1B, are provided to disconnect the amplifier from the system. This circuit disconnect includes insertion of terminating resistance(s) 105 and 107 to close the open circuit. The inserted resistance(s) 105 and 107 dissipate continuous power and hence lower power efficiency of the system.

It is readily apparent from the schematic of FIG. 1B that the two terminating resistors 105 and 107 switched into the circuit upon failure of amplifier 102 and provide a power dissipation path. Additionally the signal-to-noise ratio (SNR) is also degraded by such an amplifier failure. The degradation typically amounts to a 3dB lowering of SNR due to added loss of the RF combining device. The maximum power handling capability is also lowered by a minimum of 6dB (i.e., 3dB loss from the loss of the active device, and 3dB from the impedance insertion of the RF combining device). The dynamic range of the system is reduced by a minimum of 9dB.

Alternative arrangements may include switching active amplifiers into and out of the circuit upon an amplifier failure. This switched arrangement readily allows for the recovery from an amplifier failure without significant loss of dynamic range, but the continuous maintenance of an unused inactive amplifier is required (i.e., maintenance of duplicated active devices with each individually meeting full power requirements is required).

Figure 2:
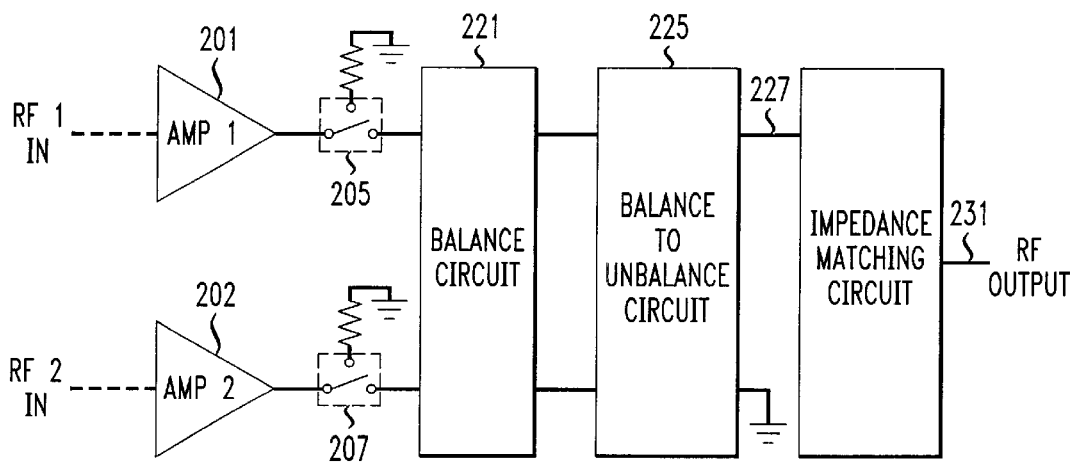
FIG. 2 is a block schematic of a switch/coupler incorporating principles of the invention.

Switched/combined redundancy is provided by circuitry for switching and combining in the event of an amplifier failure, such as shown in block schematic in the FIG. 2, provides for compensating for a failed amplifier without significantly reducing the dynamic range of the cable system.

A particular embodiment of a switch/combiner permits amplifier backup by using either a switched combined mode or a parallel combined mode to protect against an amplifier failure of either amplifier 201 and 203. It comprises two switches 205 and 207 connecting amplifiers 201 and 203 to a balancer circuit 211 which forces the outputs of both amplifiers to be in balance when both switches are in the conducting closure state. If one of the amplifiers fails, its associated switch opens (due to operation of an amplifier sensing control, not shown) and connects the failed amplifier output to a ground state. The other amplifier continues to provide amplified power through its associated connecting switch to the balance circuit 221.

The balance circuit 221 in both instances provides a balanced output, which is applied to the balance-to-unbalance circuit 225, which provides an unbalanced output at lead 227. This unbalanced output is applied to an impedance matching circuit, which operates to provide an appropriate impedance match relative to the number of amplifiers operating and hence maintain a desirable dynamic range of operation. The RF output is provided at lead 231.

Figure 3:
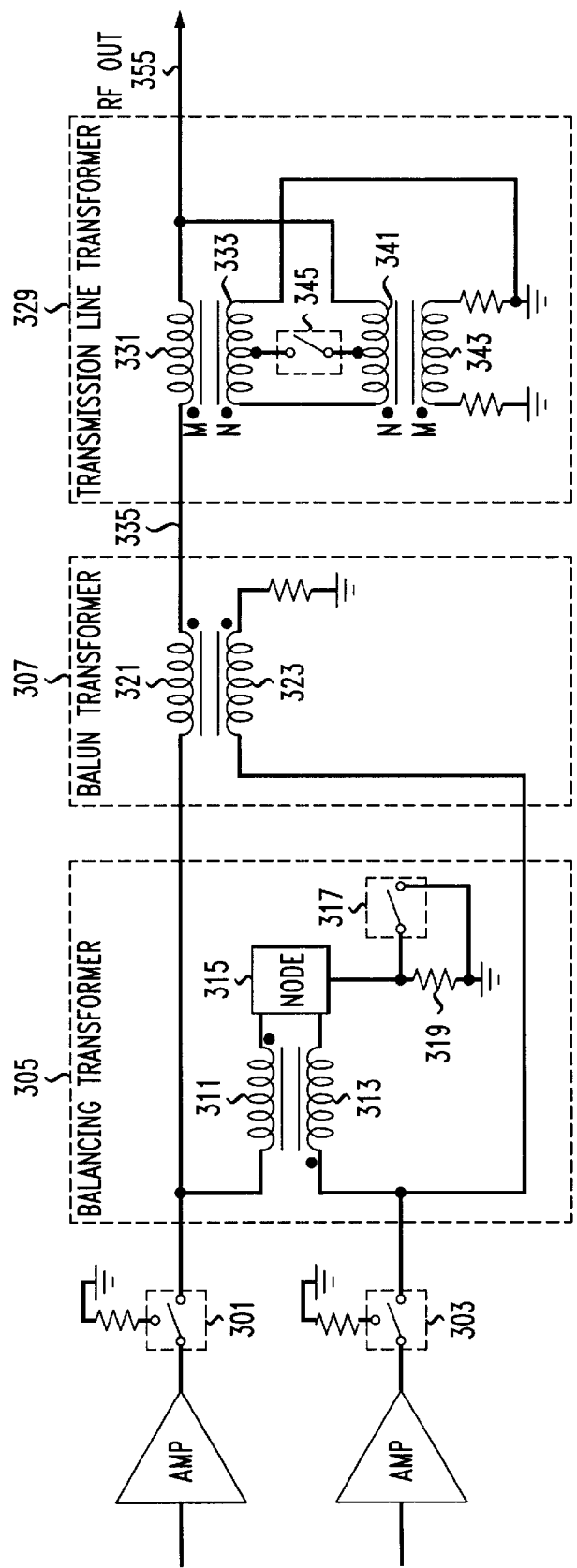
FIG. 3 is a circuit schematic of switch coupler having the functionality of the switch coupler of FIG. 2.

An exemplary lumped circuit embodiment utilizing passive magnetic devices is shown in schematic form in the FIG. 3. Two RF amplifiers are connected to the two input switches 301 and 303 respectively. Input switch 301 and 303 are connected to the magnetically coupled windings 311 and 313 (i.e., 1-to-1 turns ratio) of balancing transformer 305. The magnetic polarity experienced by the windings develops opposing EMFs (i.e., bucking voltages) and forces the output of the amplifiers at switches 301 and 303 to maintain an output balance with respect to each other. The two windings 311 and 313 are connected with each other at node 315 and to switch 317 and are either directly connected to ground or connected through impedance 319 to ground.

Balanced amplifier outputs are applied to windings 321 and 323 (i.e., 1-to-1 turns ratio) of a balun transformer 307. Windings 321 and 323 are directly connected to input switches 301 and 303 respectively and are magnetically coupled with each other to produce (i.e., by means of additive EMFs) a balanced to unbalanced conversion of the RF amplified signals.

The unbalanced amplified signal is applied, via line 335, to a transmission line transformer 329, which prepares the RF signals for application to the subsequent cable network at RF output 355. Transformer 329 includes two pairs of magnetically coupled windings; the first pair comprising windings 331 and 333 and the second pair comprising windings 341 and 343. A switch 345 electrically connects mid-point taps of the windings 333 and 341.

The switches 301, 303, 317 and 345 are under control of sensing circuitry (not shown), which monitors the state of the RF amplifiers. If both RF amplifiers are functioning properly, (i.e., functional and outputting equal amplitudes) switches 301 and 303 are positioned to connect the two RF amplifiers to the windings 311 and 313 respectively. Switches 317 and 345 are maintained in an open position, whereby node 315 is connected to resistor 319 and the two midpoint taps of windings 333 and 341 are not connected. Both input RF signals are connected to the RF output terminal 355. With the indicated switch settings all ports are matched and the turns ratio corresponds to N/M=2.5 where M and N are the respective turns of windings 331 and 333 to 341, respectively.

Upon a detection of failure or nonuse of the amplifier coupled to switch 303, switch 303 is opened to disconnect the non-functional amplifier from the balancing transformer 305 and connect the output to ground via a resistor. Switches 317 and 345 are closed so that windings 311 and 313 are grounded and the winding midpoints are connected so that M=N and the transformer 329 operates as an impedance matching transmission line.

If the amplifier connected to switch 301 is non-functional, switch 301 is opened to disconnect the non-functional amplifier from the balancing transformer 305 and connect the amplifier output to ground via a resistor. Again, both switches 317 and 345 are closed (whereby N=M).

It is to be understood that the invention is not limited to the described illustrative embodiment but is to be governed by the scope of the claims.

What is claimed is:

1. A method of providing backup for amplifier failure in a coaxial cable plant including a stage of paralleled first and second amplifiers, by the steps of:
   arranging for responding to a failure of one of the first and second amplifiers, by:
      balancing outputs of the first and second amplifier;
      converting the balanced output to an unbalanced state; and
      transforming the unbalanced state into an impedance transformer/transmission line state.

2. The method of claim 1 wherein the steps of:
   balancing, converting and transforming are achieved through an agency of magnetic flux coupling.

3. The method of claim 1, wherein the step of:
   balancing is achieved by bucking of magnetic flux generated by outputs of the first and second amplifier.

4. The method of claim 3, wherein the step of:
   converting is achieved by accumulation of magnetic flux generated by outputs of the first and second amplifiers as modulated by the balancing step.

5. The method of claim 4, wherein the step of:
   transforming is achieved by using magnetically coupled devices to provide a matching transmission impedance.

6. A broadband switch for coupling and decoupling RF amplifiers from a cable system, comprising;
   first and second inputs for receiving first and second RF amplifiers;
   a balancing network connected to the first and second inputs by first and second switch devices so as receive an output of a least one of the RF amplifiers and operative for balancing outputs of the first and second RF amplifiers;
   a balance-to-unbalance network connected for converting an output of the first and second RF amplifiers to an unbalanced output; and
   an impedance matching network for creating a matching impedance for connecting an output of the first and second RF amplifiers to a cable transmission medium.

7. A broadband switch for coupling and decoupling RF amplifiers from a cable system, as claimed in claim 6, comprising;
   the balancing network including a magnetic device including magnetically coupled first and second windings connected to and oriented to balanced outputs of the first and second RF amplifiers; and
   switches to disconnect a failed amplifier from the balancing network.

8. A broadband switch for coupling and decoupling RF amplifiers from a cable system, as claimed in claim 6, comprising;
   the balance to unbalance network including a magnetic device including magnetically coupled first and second windings connected to and oriented to unbalance balanced outputs of the first and second RF amplifiers.

9. A broadband switch for coupling and decoupling RF amplifiers from a cable system, as claimed in claim 6, comprising;
   the impedance matching network including a magnetic device having a first pair of coupled windings and a second pair of magnetically coupled windings;

a switch for controllably coupling mid taps of one winding each of said first pair of coupled windings and second pair of magnetically coupled windings; and an RF output connected to one each of said first pair of coupled windings and second pair of magnetically coupled windings.

10. A method of providing redundancy in provisioning of amplifiers in a cable system; comprising the steps of constraining a balance of first and second RF amplifier outputs with a first pair of magnetically coupled windings, unbalancing the balanced outputs of said first and second RF amplifier outputs with a second pair of magnetically coupled windings to produce an unbalanced amplified signal;

selectively impedance matching the unbalanced output by adjusting an impedance level based on the number of operative RF amplifiers; and disconnecting a failed amplifier from the step of constraining balance.

11. The method of claim 10, wherein selective impedance matching includes the steps of:

adjusting relative winding ratios in a magnetic device including first and second pairs of coupled windings.

12. The method of claim 10, wherein constraining a balance of first and second RF amplifier outputs with the first pair of magnetically coupled windings and unbalanced with the second pair of magnetically coupled windings includes the steps of:

having the winding orientation of the pair of windings generate opposing flux; and using the winding EMF to balance the RF amplifier outputs.

13. The method of claim 12, wherein unbalancing the balanced outputs includes a step of:

applying the balanced output to the second pair of magnetically coupled windings which generate additive magnetic flux; and grounding one of the second pair windings and taking an output from the grounded windings.

* * * * *